US 11,533,804 B2

(12) United States Patent
Kwon et al.

(10) Patent No.: US 11,533,804 B2
(45) Date of Patent: Dec. 20, 2022

(54) WASHING MACHINE

(71) Applicant: SAMSUNG ELECTRONICS CO., LTD., Suwon-si (KR)

(72) Inventors: Baekgyu Kwon, Suwon-si (KR); Jong-Hun Sung, Suwon-si (KR); Kwangmin Chun, Suwon-si (KR); Byeongwoo Kim, Suwon-si (KR); Yoonseob Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 280 days.

(21) Appl. No.: 16/881,216

(22) Filed: May 22, 2020

(65) Prior Publication Data
US 2020/0375019 A1 Nov. 26, 2020

(30) Foreign Application Priority Data

May 24, 2019 (KR) ........................ 10-2019-0061075

(51) Int. Cl.
*H05K 1/02* (2006.01)
*H05K 5/00* (2006.01)
*D06F 34/08* (2020.01)

(52) U.S. Cl.
CPC ........... *H05K 1/0209* (2013.01); *D06F 34/08* (2020.02); *H05K 5/0095* (2013.01)

(58) Field of Classification Search
CPC ..... D06F 34/08; H05K 1/0209; H05K 5/0095
See application file for complete search history.

(56) References Cited

U.S. PATENT DOCUMENTS

| | | | |
|---|---|---|---|
| 7,139,172 B2 * | 11/2006 | Bezama .................... | F28F 3/04 174/15.1 |
| 7,808,781 B2 * | 10/2010 | Colgan ................. | H01L 23/473 257/714 |
| 9,477,275 B2 * | 10/2016 | Choudhury ......... | H01L 23/4336 |
| 9,668,334 B2 * | 5/2017 | Refai-Ahmed .... | H05K 7/20154 |

(Continued)

FOREIGN PATENT DOCUMENTS

| | | | |
|---|---|---|---|
| JP | 07-048545 B | * | 5/1995 |
| JP | 11-137892 A | | 5/1999 |

(Continued)

OTHER PUBLICATIONS

International Search Report dated Sep. 14, 2020, in corresponding International Patent Application No. PCT/KR2020/006726.

(Continued)

*Primary Examiner* — Carl J Arbes
(74) *Attorney, Agent, or Firm* — Staas & Halsey LLP (57) ABSTRACT

Provided is a washing machine having a printed circuit board (PCB) assembly. The washing machine includes a cabinet forming an external appearance thereof, a top cover coupled to an upper side of the cabinet, and a PCB assembly provided in the cabinet and configured to control the washing machine, wherein the PCB assemble includes a frame in which a PCB is accommodated and a cover covering the PCB, and the cover includes a heat dissipation path configured to dissipate heat of the PCB and a water inflow preventer configured to prevent water from being introduced into the heat dissipation path.

17 Claims, 8 Drawing Sheets

(56) References Cited

U.S. PATENT DOCUMENTS 10,020,243 B2 *   7/2018   Fukuoka ................. H01L 24/49
2010/0208430 A1 *   8/2010   Huang ............... H05K 7/20336
                                                    361/709

FOREIGN PATENT DOCUMENTS

| JP | 2005-348863 A | 12/2005 |
| JP | 4442024 | 3/2010 |
| KR | 10-0357826 B1 | 10/2002 |
| KR | 10-2007-0015282 | 2/2007 |
| KR | 10-2007-0015282 A | 2/2007 |
| KR | 10-2009-0029517 A | 3/2009 |

OTHER PUBLICATIONS

"Samsung's smart washer/dryer lets you pick when you want the cycle to end", p. 1-4 (CBS Interactive Inc. Jan. 10, 2019).

* cited by examiner

WASHING MACHINE

CROSS-REFERENCE TO RELATED APPLICATION

This application is based on and claims priority under 35 U.S.C. § 119 to Korean Patent Application No. 2019-0061075, filed on May 24, 2019 in the Korean Intellectual Property Office, the disclosure of which is incorporated herein by reference.

BACKGROUND

1. Field

The disclosure relates to a washing machine, and more specifically, to a washing machine having a printed circuit board (PCB) assembly.

2. Description of the Related Art

In general, a washing machine refers to an appliance for washing laundry by rotating a cylindrical drum containing the laundry and washing water. Such a washing machine is divided into a drum washing machine that includes a drum arranged horizontally so that the laundry is lifted upward along the inner circumferential surface of the drum or fallen when the drum rotates in a forward and reverse direction about a horizontal axis and a vertical axis washing machine that includes a drum arranged vertically and provided with a pulsator therein so that the laundry is washed using water current generated by the pulsator when the drum rotates in a forward and reverse direction about a vertical axis.

The drum washing machine includes a cabinet defining the external appearance thereof, a drum provided inside the cabinet and rotating by a rotational force of a motor, a tub disposed between the drum and the cabinet to store wash water, a front panel disposed in the front of the cabinet and provided at a central portion thereof with an inlet through which laundry is put in or taken out, and a door installed on the front panel to open and close the inlet and prevent laundry from falling off.

A control panel is provided on the front panel of the cabinet to provide display information to the user and detect user manipulation.

Provided inside the cabinet is a main printed circuit board (PCB) assembly on which a plurality of wire cables are formed and are connected to a motor, a water supply device, a drainage device, a control panel, and various sensors and to supply or control current.

Recently, in order to reduce the power consumption, inverters are widely used. However, the inverter type products are subject to a temperature rise due to internal resistance or external temperature factors of power elements of the PCB that control the driving of the motor or the like, and thus cooling is required for the inverter type products.

In addition, the main PCB assembly is located inside the cabinet or below the tub, and moisture may penetrate when wash water for washing operation is supplied or the washing machine is washed with water.

SUMMARY

Therefore, it is an object of the disclosure to provide a washing machine with an improved PCB assembly.

Therefore, it is another object of the disclosure to provide a washing machine having a PCB assembly capable of preventing moisture penetration while dissipating heat through a heat dissipation path.

Additional aspects of the disclosure will be set forth in part in the description which follows and, in part, will be obvious from the description, or may be learned by practice of the disclosure.

Therefore, it is an aspect of the disclosure to provide a washing machine including: a cabinet forming an external appearance of the washing machine; a printed circuit board (PCB) assembly provided in the cabinet and configured to control the washing machine, wherein the PCB assembly includes: a frame in which a PCB is accommodated and a cover coupled to the frame and covering the PCB, wherein the cover includes a heat dissipation path configured to dissipate heat of the PCB and a moisture inflow preventer configured to prevent water from being introduced into the heat dissipation path.

The frame may include a first region on which a main board is arranged and a second region positioned on at least one side of the first region, wherein the first region may have a temperature H1 higher than a temperature H2 of the second region.

The main board and a heat sink may be arranged on the first region.

The cover may include a first cover that covers the first region and a second cover that covers the second region.

The first cover may be integrally formed with the second cover.

The heat dissipation path may be formed on the first cover.

The moisture inflow preventer may be provided on the first cover.

The heat dissipation path may include: an inlet formed at a lower portion of the cover and allowing external air to be introduced therethrough; and an outlet formed at an upper portion of the cover and allowing the air introduced through the inlet and heat exchanged with the PCB to be discharged therethrough.

The inlet may be formed on a lower surface of the first cover to cause the external air to move upward, and the outlet may be formed on an upper end of a front surface of the first cover to cause the heat exchanged air to move forward.

The moisture inflow preventer may include a water inflow prevention rib protruding from a rear end of an upper surface of the first cover, and the water inflow prevention rib may be formed at a position corresponding to a position of the outlet.

The water inflow prevention rib may be arranged at an upper end of the outlet.

The first cover and the second cover may each include a plurality of heat dissipation holes formed to dissipate heat of the PCB.

At least some of the plurality of heat dissipation holes may further include a water guide that is provided at an upper side of the at least some of the plurality of heat dissipation holes and sloping downward to prevent water from penetrating into the at least some of the plurality of heat dissipation holes.

The water guide may be formed on at least some of the plurality of heat dissipation holes.

It is another aspect of the disclosure to provide a washing machine including a cabinet forming an external appearance thereof, a top cover coupled to an upper side of the cabinet, and a printed circuit board (PCB) assembly provided in the cabinet and configured to control the washing machine, wherein the PCB assemble may include: a frame having a first region on which a higher temperature heat emitting element is mounted and a second region, adjacent to the first region, on which a lower temperature heat emitting element is mounted; and a cover coupled to the frame and having a first part covering the first region and a second part covering the second region, wherein the cover may include: a plurality of heat dissipation holes formed in each of the first part and the second part to dissipate heat of the first region and the second region, a heat dissipation path including an inlet formed at a lower end of the first part and an outlet at an upper end of the first part, and a water inflow preventer formed in the first part to prevent water from being introduced into the heat dissipation path.

The main board and a heat sink may be arranged on the first region, and the first region may have a temperature H1 higher than a temperature H2 of the second region.

The inlet may be formed on a lower surface of the first part to cause external air to move upward, and the outlet may be formed on an upper end of a front surface of the first part to cause heat exchanged air to move forward.

The moisture inflow preventer may include a water inflow prevention rib protruding from a rear end of an upper surface of the cover, and the water inflow prevention rib may be formed at a position corresponding to a position of the outlet.

The water inflow prevention rib may be arranged at an upper end of the outlet.

At least some of the plurality of heat dissipation holes may further include a water guide provided at an upper side of the plurality of heat dissipation holes and sloping downward to prevent water from penetrating into the plurality of heat dissipation holes.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

The embodiments set forth herein and illustrated in the configuration of the present disclosure are only the most preferred embodiments and are not representative of the full the technical spirit of the present disclosure, so it should be understood that they may be replaced with various equivalents and modifications at the time of the disclosure.

Throughout the drawings, like reference numerals refer to like parts or components.

The terminology used herein is for the purpose of describing particular embodiments only and is not intended to limit the disclosure. It is to be understood that the singular forms "a," "an," and "the" include plural references unless the context clearly dictates otherwise. It will be further understood that the terms "include", "comprise" and/or "have" when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. Thus, a first element, component, region, layer or section discussed below could be termed a second element, component, region, layer or section without departing from the teachings of the disclosure. Descriptions shall be understood as to include any and all combinations of one or more of the associated listed items when the items are described by using the conjunctive term "~ and/or ~," or the like.

Hereinafter, embodiments according to the disclosure will be described in detail with reference to the accompanying drawings.

Figure 1:
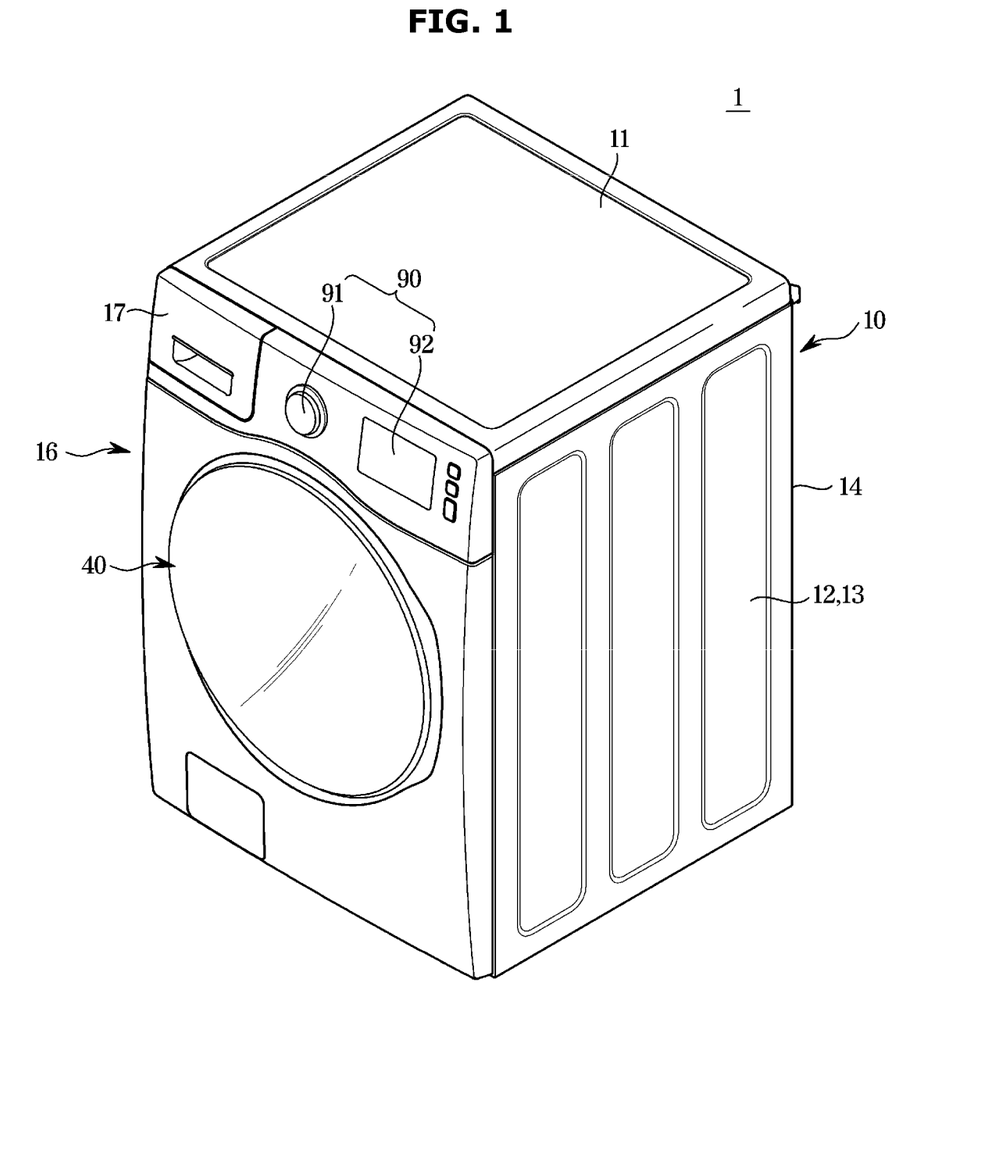
FIG. 1 is a perspective view illustrating a washing machine according to an embodiment of the disclosure.
Figure 2:
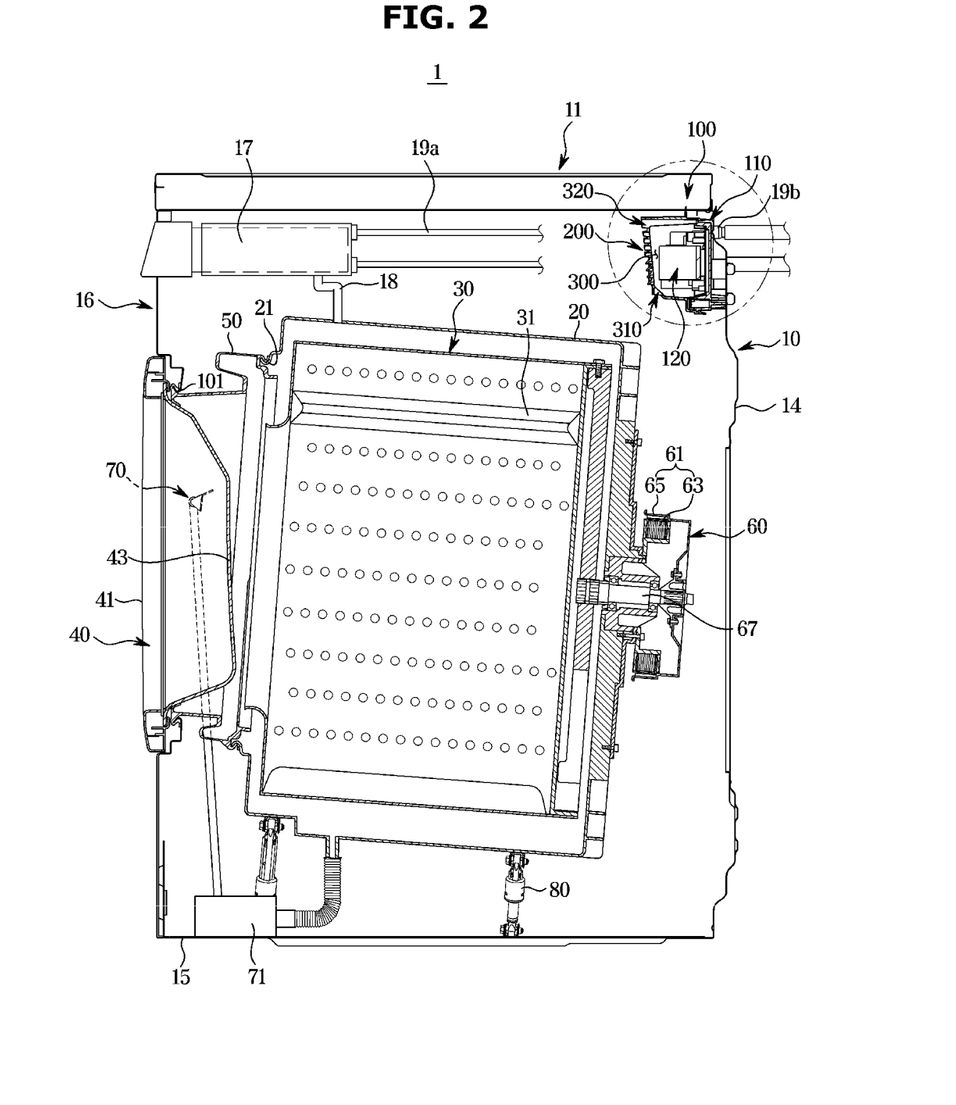
FIG. 2 is a cross-sectional view illustrating a washing machine according to an embodiment of the disclosure.
Figure 3:
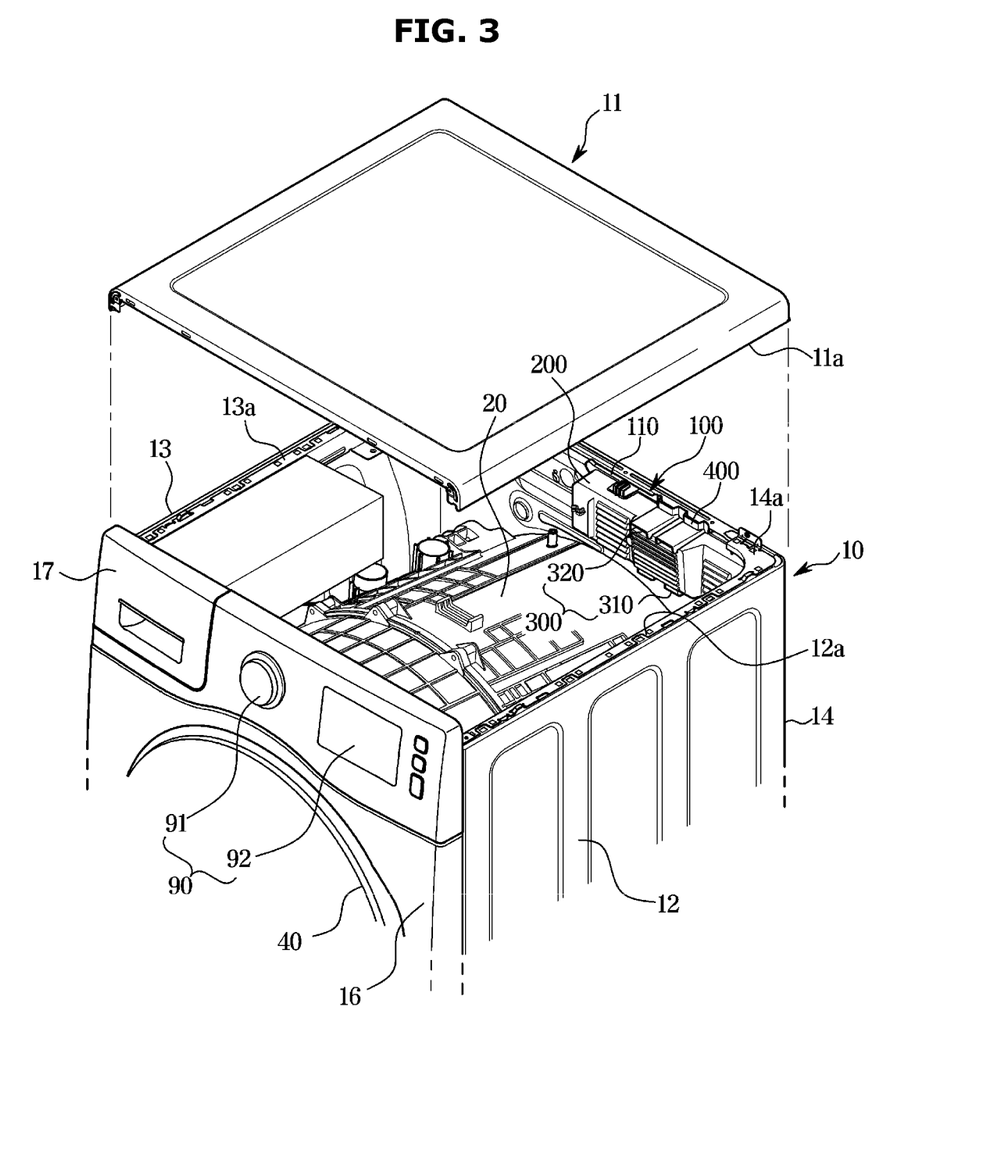
FIG. 3 is a view illustrating a PCB assembly installed in a cabinet according to an embodiment of the disclosure.

FIG. 1 is a perspective view illustrating a washing machine according to an embodiment of the disclosure, FIG. 2 is a cross-sectional view illustrating the washing machine according to the embodiment of the disclosure, and FIG. 3 is a view illustrating a PCB assembly installed in a cabinet according to the embodiment of the disclosure.

The washing machine 1 shown in FIGS. 1 to 3 includes a cabinet 10 forming an external appearance thereof and accommodating various components therein, a tub 20 provided inside the cabinet 10 to store mixed water in which wash water is mixed detergent, a drum 30 provided inside the tub 20 to accommodate laundry and rotate, and a driving device 60 rotating the drum 30.

The cabinet 10 may be formed in a substantially hexahedral shape. The cabinet 10 may be formed in a box shape with an open front. The cabinet 10 may include a back plate 14 and side plates 12 and 13 disposed on one side and the other side in front of the back plate 14. In the embodiment of the disclosure, the cabinet is illustrated as having the back plate and side plates integrally formed with each other, but the spirit of the disclosure is not limited thereto. The cabinet 10 may include a front panel 16 provided on the open front, a base 15 provided on the bottom of the cabinet 10, and a top cover 11 provided on the upper surface. The top cover 11 may be formed of a quadrangular plate having a size corresponding to the upper surface of the cabinet 10. The top cover 11 may include top cover edges 11a formed by lateral sides and a rear side of the top cover 11 bent downward and extending. The top cover edges 11a may be formed to be coupled to an upper end of the cabinet 10.

The back plate 14 and the side plates 12 and 13 are provided with a back plate edge 14a and side plate edges 12a and 13a formed by bending of upper ends of the back plate 14 and the side plates 12 and 13. The back plate edge 14a and each of the side plate edges 12a and 13a may be formed to correspond to the top cover edges 11a of the top cover 11.

The base 12 may be formed to cover the lower portion of the cabinet 10.

A control panel 90 having an inputter 91 that receives an operation command from a user and a display 92 that displays operation information of the washing machine 1 may be provided on the front surface of the cabinet 10.

An opening may be formed in the front panel 16 so that laundry may be introduced into the drum 30. In the tub 20 and the drum 30, an opening is formed so that laundry is inserted or withdrawn therethrough at the front of the cabinet 10, and the openings of the tub 20 and the drum 30 correspond to the opening of the front panel 16.

The opening provided in the front panel 16 may be opened and closed by the door 40. The door 40 may be rotatably mounted on the front panel 16 of the cabinet 10 by a hinge member (not shown). The door 40 may include a door frame 41 and a door glass 43. The door glass 43 may be formed of a transparent tempered glass material that allows the interior of the cabinet 10 to been seen therethrough.

On the upper portion of the tub 20, a water supply valve 19b and water supply pipes 19b for controlling water supply, and a detergent supply device 17 for supplying detergent into the tub 20 in the water supply process may be installed.

The detergent supply device 17 may be connected to the tub 20 through a supply pipe 16. Wash water supplied through the water supply pipe 19b is mixed with detergent via the detergent supply device 17, and the mixed water in which the wash water and the detergent are mixed may be supplied into the tub 20.

The driving unit 60 may be provided at the rear of the drum 30. The driving unit 60 is configured to rotate the drum 30, and may be provided to transmit the driving force generated by the motor 61 to a rotating shaft 67 to rotate the drum 30.

The motor 61 includes a stator 63 and a rotor 65 that rotates by electromagnetic interaction with the stator 63 to convert electrical power into mechanical power.

The tub 20 stores mixed water in which laundry and detergent are mixed, and may be formed in a substantially cylindrical shape. The tub 20 may be fixed inside the cabinet 10. The opening of the front panel 16 may be connected to the tub 20 by a diaphragm 50.

At one side of the diaphragm 50, an injection nozzle 70 is provided to connect a circulation hose and injects circulated mixed water into the drum 30. The injection nozzle 70 is provided to inject the mixed water evenly over the entire laundry accommodated in the drum 30. The circulation hose may be connected to a circulation pump 71 for pumping the mixed water stored in the lower portion of the tub 20.

The drum 30 may perform washing by lifting and falling laundry while rotating inside the tub 20. A plurality of lifters 31 may be provided inside the drum 30.

A drainage device (not shown) including a drain pipe (not shown) and a drain valve (not shown) for draining water inside the tub 20 may be installed on the lower portion of the tub 20.

The tub 20 is provided to be elastically supported from the cabinet 10 by a spring (not shown) at an upper side thereof and dampers 80 at a lower side thereof. That is, the spring and the dampers 80 absorb vibration energy between the tub 20 and the cabinet 10 when the vibration generated duration rotation of the drum 30 is transmitted to the tub 20 and the cabinet 10, thereby attenuating the vibration transmitted to the main body 10.

The washing machine 1 may include a printed circuit board (PCB) assembly 100 on which various electrical parts (hereinafter, referred to as "heating elements") that control the washing machine 1 according to input of the control panel 90 are mounted.

The PCB assembly 100 may be disposed at the rear of the washing machine 1. The PCB assembly 100 may be disposed behind the tub 20 of the cabinet 10. The PCB assembly 100 may be installed on an upper side of the back plate 14 of the cabinet 10. In detail, the PCB assembly 100 may be installed on an upper side of the back plate 14 of the cabinet 10, below the top cover 11.

The PCB assembly 100 installed between the back plate 14 and the top cover 11 of the cabinet 10 may be overheated by heat generated from various electrical parts 123 in the PCB assembly 100. In addition, when the cabinet 10 is installed outdoors or is sprayed with water for cleaning, moisture may penetrate into the PCB assembly 100 and cause serious product defects.

Accordingly, the PCB assembly 100 may include a heat dissipation path 300 provided to dissipate heat of a PCB 120 and a moisture inflow preventer 400 provided to prevent water from entering through the heat dissipation path 300.

Figure 4:
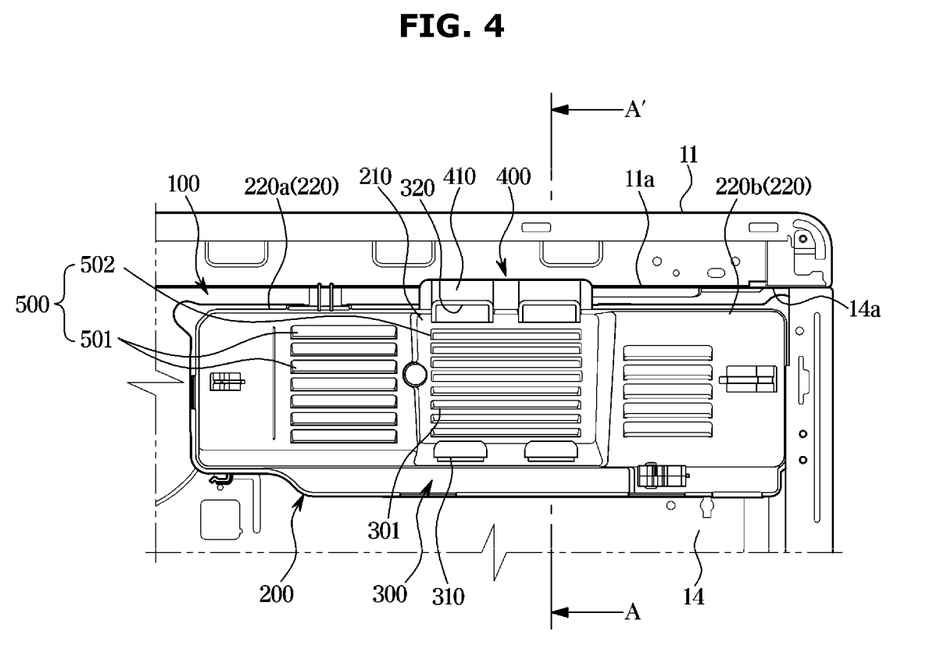
FIG. 4 is a front view illustrating a PCB assembly according to an embodiment of the disclosure.
Figure 5:
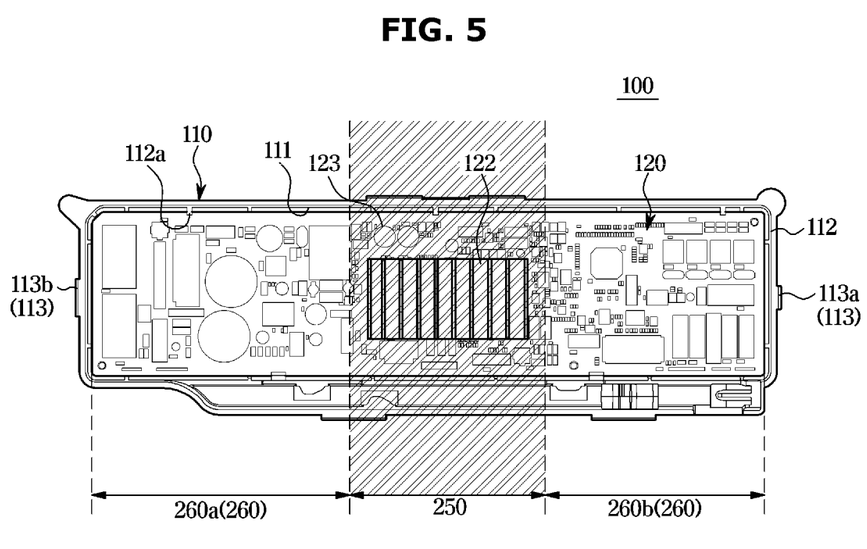
FIG. 5 is a view illustrating a first region and a second region of a PCB assembly according to an embodiment of the disclosure.
Figure 6:
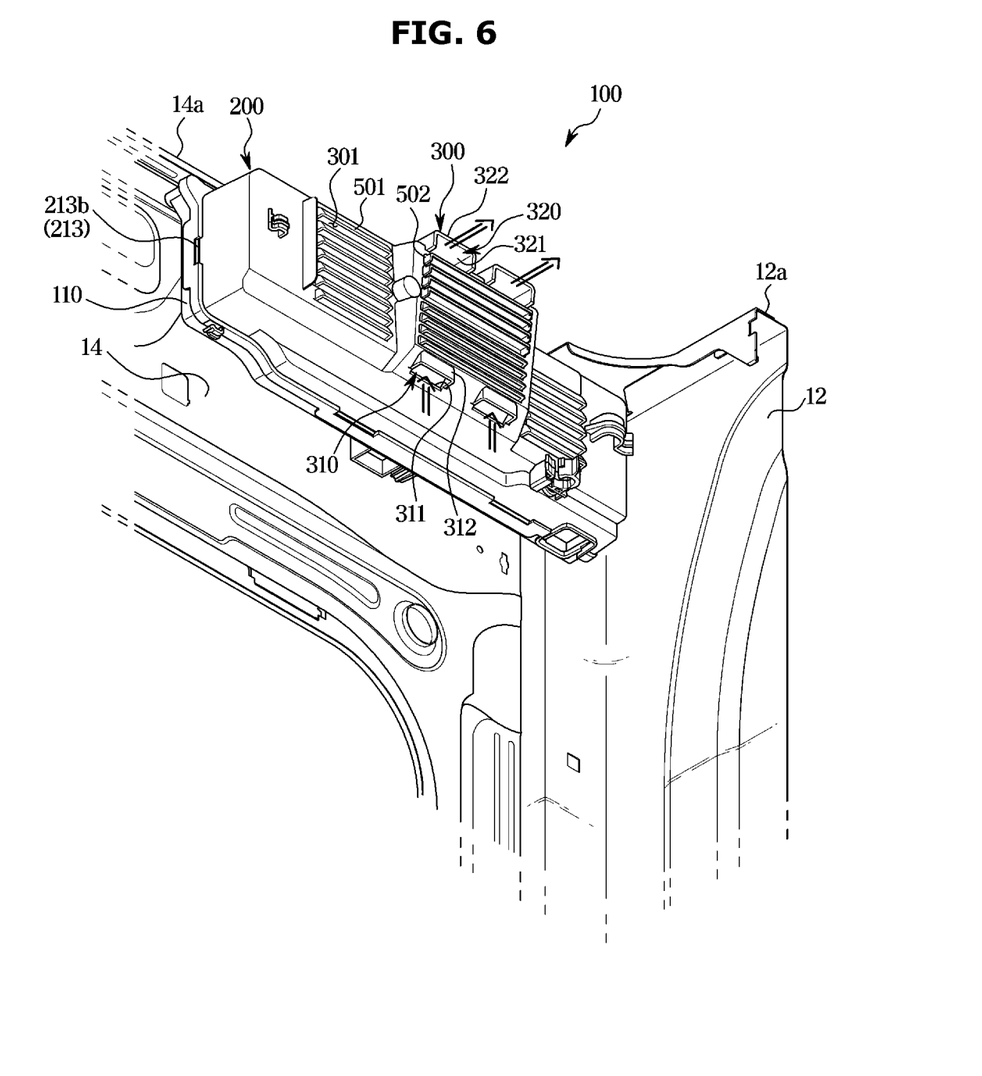
FIG. 6 is a perspective view showing a heat dissipation path of a PCB assembly according to an embodiment of the disclosure.
Figure 7:
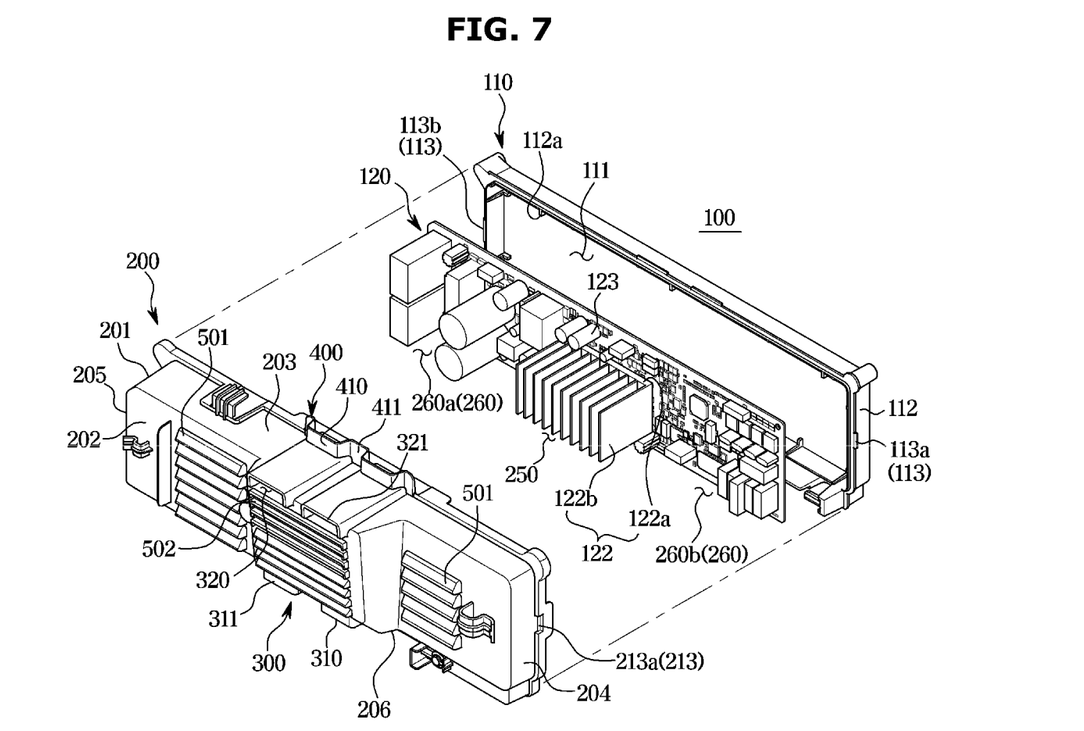
FIG. 7 is an exploded perspective view illustrating a PCB assembly according to an embodiment of the disclosure.
Figure 8:
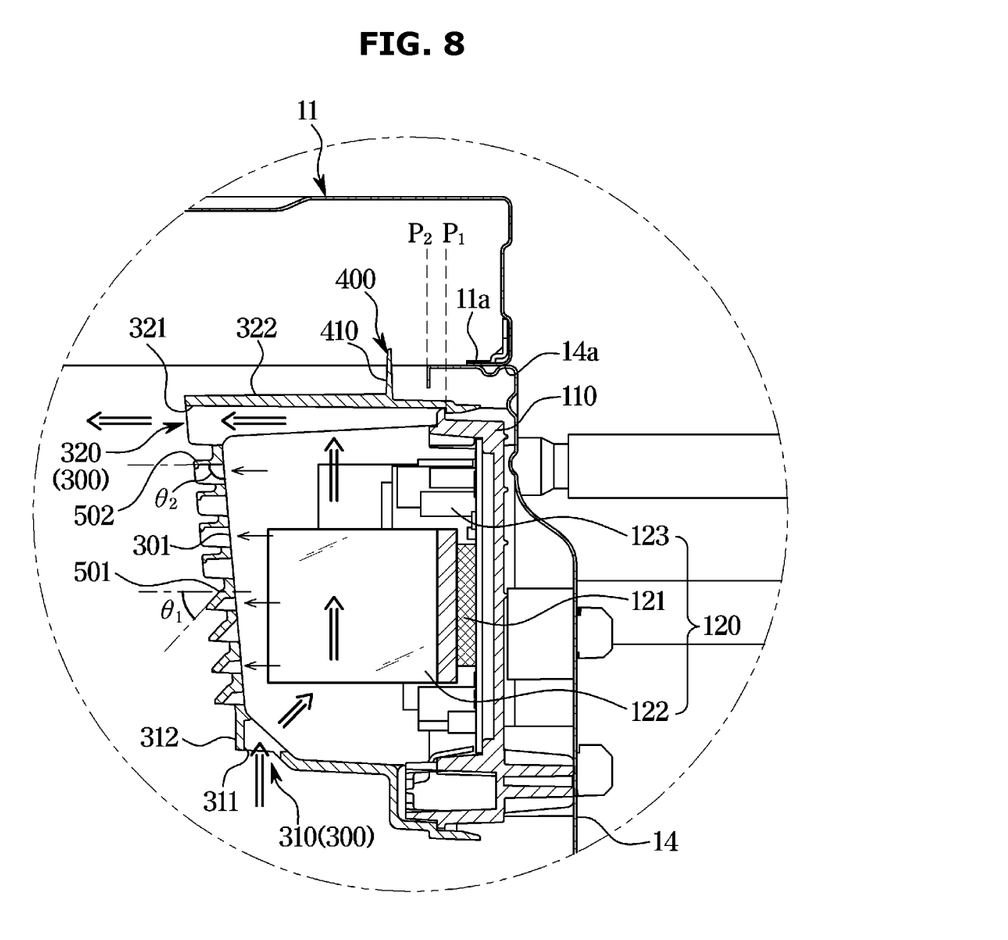
FIG. 8 is a cross-sectional view taken along line A-A' of FIG. 7.

FIG. 4 is a front view illustrating the PCB assembly according to the embodiment of the disclosure, FIG. 5 is a view illustrating a first region and a second region of the PCB assembly according to the embodiment of the disclosure, FIG. 6 is a perspective view showing the heat dissipation path of the PCB assembly according to the embodiment of the disclosure, FIG. 7 is an exploded perspective view illustrating the PCB assembly according to the embodiment of the disclosure, and FIG. 8 is a cross-sectional view taken along line A-A' of FIG. 7.

Referring FIGS. 4 to 8, the PCB assembly 100 includes a frame 110 provided to accommodate the PCB 120 therein and a cover 200 provided to be coupled to the frame 110 to cover the PCB 120.

The PCB 120 may have various electrical parts, such as a main board 121 (hereinafter, a heating element 123), mounted thereon. The main board 121 may be disposed at the center of the PCB 120. The PCB 120 may include a heat sink 122 provided to efficiently dissipate heat. The main board 121 may include the heat sink 122 provided to dissipate heat. The heat sink 122 may be disposed at the center of the PCB 120 to efficiently dissipate the heat of the entire PCB 120.

The heat sink 122 may include a base 122a installed in close contact with the main board 121 and a plurality of heat heatsink portions 122b vertically installed on the base 122a. The plurality of heat heatsink portions 122b may be provided to protrude forward of the base 122a. The plurality of heat heatsink portions 122b may be disposed to be spaced apart from each other.

The frame 110 is provided to be installed on the cabinet 10. The PCB 120 may be installed inside the frame 110. The frame 110 may be formed in a hexahedral shape with an open front side. The frame 110 may include an accommodation space 111 so that the PCB 120 is accommodated therein. The accommodation space 111 may be formed in a size and shape corresponding to those of the PCB 120. The frame 110 may include a frame edge 112 surrounding all sides. The frame edge 112 may be provided with a cover coupling portion 113 corresponding to a fixing portion 213 of the cover 200 to be described below. The cover coupling portions 113 (113a and 113b) may be formed on the left and right sides of the frame border 112. A plurality of support ribs 112a for supporting the PCB 120 may be provided at an inside of the frame edge 112. The plurality of support ribs 112a may be spaced apart from each other. The plurality of support ribs 112a are provided so that the PCB 120 is stably supported in the accommodation space 111 of the frame 110.

The frame 110 may include a first region 250 in which the main board 121 is disposed, and a second region 260 except for the first region 250. The second region 260 may include the second region 260a formed on one side of the first region 250 and the second region 260b formed on the other side of the first region 250.

During operation of the washing machine, the first region 250 of the frame 110 has a first temperature H1 higher than a second temperature H2 of the second region 260 of the frame 110, due to the main board 121 being disposed in the first region 250. In the embodiment of the disclosure, the first region 250 is disposed at the center of the frame 110 and the second regions 260 are formed on one side and the other side of the first region 250. However, the spirit of the disclosure is not limited thereto. For example, the first region may be formed at one end of the frame or may be formed at the other end. The first region includes a region in which the main board 121 or the heat sink of the PCB is located.

The PCB assembly 100 may include the first region 250 in which the main board 121 is disposed, and the second region 260 except for the first region 250. The temperature of the first region 250 may be formed relatively higher than the temperature of the second region 260.

During operation of the washing machine, the first temperature H1 of the first region 250 may be higher than the second temperature H2 of the second region 260, due to the main board 121 being disposed in the first region. The second temperature H2 of the second region 260 may be lower than the first temperature H1 of the first region 250.

The cover 200 may be provided to be coupled to the frame 110 to cover the PCB 120. The cover 200 may be provided to prevent external shock or moisture penetration.

The cover 200 may be provided in a size and shape corresponding to those of the frame 110. The cover 200 may be formed in a hexahedral shape with an open rear surface. The cover 200 may include a cover body 201 having a hexahedral shape with one surface open. The cover body 201 includes a cover front surface 202 provided at the front, a cover top surface 203 extending from an upper end of the cover front surface 202, and a cover bottom surface 206 extending from a lower end of the cover front surface 202, and cover lateral side surfaces 204 and 205 that extend from opposite sides of the cover front surface 202.

Fixing portions 213 corresponding to the cover coupling portions 113 of the frame 110 may be provided on the cover lateral side surfaces 204 and 205 of the cover 200. The fixing portions 213 (213a and 213b) of the cover 200 may be formed on the cover lateral side surfaces 204 and 205, respectively. The cover 200 may be fixed to the cover coupling portion 113 of the frame 110 through the fixing portion 213. The fixing portion 213 of the cover 200 and the cover coupling portion 113 of the frame 110 may be separably provided by a hook method.

The cover 200 may include a first cover 210 provided to cover the first region 250 and a second cover 220 provided to cover the second region 260. The first cover 210 may be formed at the center to correspond to the first region 250. The second covers 220 (220a and 220b) may be formed on one side and the other side of the first region 250 to correspond to the second region 260. The first cover 210 and the second cover 220 may be integrally formed with each other. In the embodiment of the disclosure, the first cover and the second cover are illustrated as being integrally formed with each other, but the spirit of the disclosure is not limited thereto. For example, the first cover and the second cover may be formed separately and coupled to each other.

The cover 200 may include the heat dissipation path 300 provided to dissipate heat of the PCB 120 and the moisture inflow preventer 400 provided to prevent water from being introduced into the heat dissipation path 300.

The cover 200 may include a heat dissipation hole 301 formed to dissipate the heat of the PCB 120 to the outside. The heat dissipation hole 301 is provided to discharge hot air heated from the PCB 120 inside the cover 200 to the outside. The heat dissipation hole 301 may include a hole, a slot, an opening, and the like that are horizontally formed in an elongated shape. The heat dissipation hole 301 may be formed in plural. The heat dissipation hole 301 may be formed in the cover front surface 202 of the cover 200. The plurality of heat dissipation holes 301 may be spaced apart from each other. The plurality of heat dissipation holes 301 may be arranged side by side. The plurality of heat dissipation holes 301 may be formed in each of the first region 250 and the second region 260 of the cover 200.

The plurality of heat dissipation holes 301 may include a water guide 500 to prevent water from being introduced into the plurality of heat dissipation holes 301.

The water guide 500 may be disposed on the upper end of the heat dissipation hole 301. The water guide 500 may be formed to be inclined downward on the upper side of the heat dissipation hole 301. The water guide 500 may be installed on the upper end of the heat dissipation hole 301 to cover the heat dissipation hole 301. The water guide 500 is provided to prevent water moving from the upper side to the lower side from entering the inside of the PCB assembly 100 through the heat dissipation hole 301. The water guide 500 may be formed on at least a portion of the plurality of heat dissipation holes 301.

The water guide 500 may include a first guide 501 and a second guide 502. The first guide 501 and the second guide 502 may be formed at different angles. The first guide 501 may be formed at a first angle ($\theta 1$, see FIG. 8). The second guide 502 may be formed at a second angle ($\theta 2$, see FIG. 8). The second angle $\theta 2$ may be formed larger than the first angle $\theta 1$. The second angle $\theta 2$ may be formed at approximately 90 degrees or less.

The second guide 502 having the second angle $\theta 2$ merely covers the heat dissipation hole 301 at the upper side rather than covering the entire front surface of the heat dissipation hole 301, and thus does not interferes the flow of hot air discharged from the inside of the cover 200 to the outside and does not exert an influence on heat dissipation.

Accordingly, the internal air of the first region 250 having a relatively high temperature H1 is dissipated through the plurality of heat dissipation holes 301 covered by the second guide 502, and the internal air of the second region 260 having a relatively low temperature H2 is dissipated through the plurality of heat dissipation holes 301 covered by the first guide 501.

The first guide 501 may be provided on the plurality of heat dissipation holes 301 formed in the second region 260. The second guide 502 may be provided on the plurality of heat dissipation holes 301 formed in the first region 250. The second guide 502 may be provided in at least a portion of the plurality of heat dissipation holes 301 formed in the first region 250. The first guide 501 may be installed on at least a portion of the plurality of heat dissipation holes 301 in the first region 250 and the second guide 502 may be installed on another portion of the plurality of heat dissipation holes 301 in the first region 250. The first guide 501 may be provided on the heat dissipation holes 301 formed in the lower portion among the plurality of heat dissipation holes 301 in the first region 250, and the second guide 502 may be provided on the heat dissipation holes 301 formed in the upper portion among the plurality of heat dissipation holes 301 in the first region 250.

The heat dissipation path 300 and the moisture inflow preventer 400 provided on the cover 200 may be formed at a position corresponding to the first region 250. The heat dissipation path 300 and the moisture inflow preventer 400 may be formed on the first cover (hereinafter, referred to as "a cover").

The heat dissipation path 300 may include an inlet part 310 provided to allow outside air to flow into the cover 200 and exchange heat with the heat sink 122 and an outlet part 320 provided to allow the heat exchanged air to be discharged to the outside.

Since the air heated by the main board 121 and the heat sink 122 of the PCB assembly 100 moves from the bottom to the top, the inlet part 310 of the heat dissipation path 300 is disposed on the lower portion of the cover 200 and the outlet part 320 is disposed on the upper portion of the cover 200. The inlet part 310 may be provided at a position corresponding to the lower end of the heat sink 122. The outlet part 320 may be provided at a position corresponding to the upper end of the heat sink 122.

The inlet part 310 of the heat dissipation path 300 may be formed on the cover bottom surface 206 of the cover 200. The inlet part 310 may include an inlet 311 formed as an opening in the cover bottom surface 206 and an inlet guide 312 guiding outside air to enter the inlet 311. The inlet guide 312 may be formed by protrusion of the inlet 311. The inlet guide 312 may be formed at an edge along a circumference of the inlet 311. The inlet guide 312 may be formed to allow outside air to enter the inlet 311.

The outlet part 320 of the heat dissipation path 300 may be formed on the cover front surface 202 of the cover 200. The outlet part 320 may include an outlet 321 formed as an opening in the upper end of the cover front surface 202 and an outlet guide 322 guiding inside air to be discharged through the outlet 321. The outlet guide 322 may be formed to extend from the cover top surface 203.

The outlet guide 322 may be formed at a second angle 82 on the upper side of the discharge port 321. The discharge guide 322 guides the hot air inside the cover 200 to move upward and be discharged forward.

The heat dissipation path 300 formed in the first region 250 allows high-temperature air generated inside the PCB assembly 100 and low-temperature outside air to have natural convection, and the heat dissipation cooling efficiency of the heat sink 122 may be improved.

The moisture inflow preventer 400 formed on the cover 200 is provided to prevent moisture from flowing into the heat dissipation path 300. The moisture inflow preventer 400 may be formed in the first region 250 of the cover 200. The moisture inflow preventer 400 may be formed on the cover top surface 203 of the cover 200. The moisture inflow preventer 400 may be disposed at a rear end of the cover top surface 203 of the cover 200. The moisture inflow preventer 400 may be disposed at a position corresponding to the heat dissipation path 300. The moisture inflow preventer 400 may be disposed at a position corresponding to the outlet 321 of the heat dissipation path 300. The moisture inflow preventer 400 is provided to prevent water flowing between the top cover 11 and the cabinet 10 from penetrating into the PCB assembly 100. The moisture inflow preventer 400 is provided to prevent water flowing between the top cover 11 and the back plate 14 of the cabinet 10 from penetrating into the PCB assembly 100. The moisture inflow preventer 400 prevents water flowing into a gap between the top cover edge 11a of the top cover 11 and the back plate edge 14a of the back plate 14 from penetrating into the PCB assembly 100.

In detail, the moisture inflow preventer 400 may be disposed at the rear end of the upper surface of the first cover 210 to cover the heat dissipation path 300. The moisture inflow preventer 400 may include a moisture inflow prevention rib 411 that protrudes so as to block the flow of water. The moisture inflow prevention rib 411 may be formed to protrude upward from the cover top surface 203 of the first cover 210. The moisture inflow prevention rib 411 may be formed to prevent water flowing into a gap at a coupling portion between the top cover 11 and the cabinet 10 from penetrating into the front surface of the cover 200 of the PCB assembly 100. The water inflow prevention rib 411 prevents water flowing into a gap at a coupling portion between the top cover edge 11a and the back plate edge 14a from flowing to the front of the cover 200 of the PCB assembly 100 and then penetrating into the heat dissipation path 300.

In this case, a first position P1 where the gap of the coupling portion between the frame 110 and the cover 200 of the PCB assembly 100 is located is spaced apart from a second position P2 wherein the gap of the coupling portion between the top cover 11 and the back plate 14 of the cabinet 10 is located so that the water flowing into the gap of the coupling portion between the top cover 11 and the back plate 14 is prevented from being introduced into the gap of the coupling portion between the frame 110 of the PCB assembly 100 and the cover 200. In detail, the first position P1 where the gap of the coupling portion between the frame 110 of the PCB assembly 100 and the cover 200 is located is located behind the second position P2 where the gap of the coupling portion between the top cover 11 and the back plate 14 of the cabinet 10 is located so that the water flowing into the gap of the coupling portion between the top cover 11 and the back plate 14 is prevented from being directly introduced into the gap of the coupling portion between the frame 110 and the cover 200 of the PCB assembly 100.

As is apparent from the above, the washing machine can dissipate heat through a heat dissipation path while preventing moisture penetration.

In addition, the temperature of the PCB can be effectively lowered through the heat dissipation path, thereby preventing deterioration and improving product reliability.

In addition, water can be prevented from penetrating into the PCB assembly, to prevent the occurrence of short circuit, and to prevent the risk of fire.

In addition, since a separate material, such as a sheet for preventing moisture penetration is not required, material cost can be saved.

Although few embodiments of the disclosure have been shown and described, the above embodiment is illustrative purpose only, and it would be appreciated by those skilled in the art that changes and modifications may be made in these embodiments without departing from the principles and scope of the disclosure, the scope of which is defined in the claims and their equivalents.

What is claimed is:

1. A washing machine comprising:
  a cabinet forming an external appearance of the washing machine;
  a printed circuit board (PCB) assembly, provided in the cabinet and configured to control the washing machine, and including:
    a frame accommodating a PCB and including a first region on which a main board is arranged and a second region positioned on at least one side of the first region, wherein during operation of the washing machine, the first region has a temperature H1 higher than a temperature H2 of the second region due to the main board being arranged on the first region, and a cover coupled to the frame and covering the PCB and including a first cover that covers the first region and a second cover that covers the second region, wherein the cover is configured to form a heat dissipation path to dissipate heat of the PCB, and includes a moisture inflow preventer configured to prevent water from being introduced into the heat dissipation path, and wherein the cover includes an inlet formed at a lower portion of the cover and allowing external air to be introduced therethrough, and an outlet formed at an upper portion of the cover and allowing the air introduced through the inlet and heat-exchanged with the PCB to be discharged therethrough, to thereby form the heat dissipation path.

2. The washing machine of claim 1, wherein a heat sink is arranged on the first region.

3. The washing machine of claim 1, wherein the first cover is integrally formed with the second cover.

4. The washing machine of claim 1, wherein the heat dissipation path is formed by the first cover.

5. The washing machine of claim 1, wherein the moisture inflow preventer is provided on the first cover.

6. The washing machine of claim 1, wherein the inlet is formed on a lower surface of the first cover to cause the external air to move upward, and the outlet is formed on an upper end of a front surface of the first cover to cause the heat exchanged air to move forward.

7. The washing machine of claim 1, wherein the moisture inflow preventer includes a water inflow prevention rib protruding from a rear end of an upper surface of the first cover, and the water inflow prevention rib is formed at a position corresponding to a position of the outlet.

8. The washing machine of claim 7, wherein the water inflow prevention rib is arranged at an upper end of the outlet.

9. The washing machine of claim 1, wherein the first cover and the second cover each include a plurality of heat dissipation holes formed to dissipate heat of the PCB.

10. The washing machine of claim 9, wherein at least some of the plurality of heat dissipation holes included in at least one of the first cover and the second cover further include water guides provided at upper sides of the at least some of the plurality of heat dissipation holes, respectively, and sloping downward to prevent water from penetrating into the at least some of the plurality of heat dissipation holes.

11. The washing machine of claim 10, wherein the water guides are formed on the at least some of the plurality of heat dissipation holes, respectively.

12. A washing machine comprising:
a cabinet forming an external appearance of the washing machine,
a top cover coupled to an upper side of the cabinet, and
a printed circuit board (PCB) assembly provided in the cabinet and configured to control the washing machine,
wherein the PCB assembly includes:
a frame having a first region on which a higher temperature heat emitting element is mounted, and a second region, adjacent to the first region, on which a lower temperature heat emitting element is mounted, and
a cover coupled to the frame and having a first part covering the first region and a second part covering the second region,
wherein the cover includes:
a plurality of heat dissipation holes formed in the first part to dissipate heat of the first region, and a plurality of heat dissipation holes formed in the second part to dissipate heat of the second region,
an inlet formed at a lower end of the first part and an outlet at an upper end of the first part, to form a heat dissipation path, and
a water inflow preventer formed in the first part to prevent water from being introduced into the heat dissipation path.

13. The washing machine of claim 12, wherein
a heat sink is arranged on the first region, and,
during operation of the washing machine, the first region has a temperature H1 higher than a temperature H2 of the second region.

14. The washing machine of claim 12, wherein
the inlet is formed on a lower surface of the first part to cause external air to move upward, and
the outlet is formed on an upper end of a front surface of the first part to cause heat exchanged air to move forward,
to thereby form the heat dissipation path.

15. The washing machine of claim 14, wherein the water inflow preventer includes a water inflow prevention rib protruding from a rear end of an upper surface of the cover, and the water inflow prevention rib is formed at a position corresponding to a position of the outlet.

16. The washing machine of claim 15, wherein the water inflow prevention rib is arranged at an upper end of the outlet.

17. The washing machine of claim 12, wherein at least some of the plurality of heat dissipation holes formed in the first part or the plurality of heat dissipation holes formed in the second part further include water guides provided at upper sides of the at least some of the plurality of heat dissipation holes, respectively, and slope downward to prevent water from penetrating into the at least some of plurality of heat dissipation holes.

* * * * *